(12) United States Patent
Nomura et al.

(10) Patent No.: US 7,586,127 B2
(45) Date of Patent: Sep. 8, 2009

(54) LIGHT EMITTING DIODE

(75) Inventors: Tadashi Nomura, Tokyo (JP); Minoru Tanaka, Tokyo (JP); Yasumasa Morita, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 11/091,777

(22) Filed: Mar. 29, 2005

(65) Prior Publication Data

US 2005/0211992 A1 Sep. 29, 2005

(30) Foreign Application Priority Data

Mar. 20, 2004 (JP) ............................. 2004-094720
Mar. 29, 2004 (JP) ............................. 2004-094774

(51) Int. Cl.
*H01L 29/20* (2006.01)
(52) U.S. Cl. .......................................... 257/89; 257/98
(58) Field of Classification Search .................... 257/89, 257/98, 99, 100
See application file for complete search history.

(56) References Cited

U.S. PATENT DOCUMENTS

| 6,066,861 | A | 5/2000 | Hohn et al. ..................... 257/99 |
| 6,245,259 | B1 | 6/2001 | Hohn et al. ............. 252/301.36 |
| 6,277,301 | B1 | 8/2001 | Hohn et al. ............. 252/301.36 |
| 6,576,930 | B2 | 6/2003 | Reeh et al. ..................... 257/98 |
| 6,577,073 | B2 * | 6/2003 | Shimizu et al. ............. 315/246 |
| 6,592,780 | B2 | 7/2003 | Hohn et al. ............. 252/301.36 |
| 6,613,247 | B1 | 9/2003 | Hohn et al. ............. 252/301.36 |
| 6,669,866 | B1 | 12/2003 | Kummer et al. ....... 252/301.4 R |
| 6,774,401 | B2 | 8/2004 | Nakada et al. ................. 257/82 |
| 6,809,342 | B2 | 10/2004 | Harada ......................... 257/79 |
| 6,812,500 | B2 | 11/2004 | Reeh et al. ..................... 257/98 |
| 7,332,746 | B1 * | 2/2008 | Takahashi et al. ............. 257/98 |

FOREIGN PATENT DOCUMENTS

| JP | 10-190065 | 12/1996 |
| JP | 2001-127346 | 10/1999 |
| JP | 2001-196639 | 1/2000 |
| JP | 2001-210872 | 1/2000 |
| JP | 2001-345483 | 5/2000 |
| JP | 2004-056075 | 12/2002 |

* cited by examiner

*Primary Examiner*—Mark Prenty
(74) *Attorney, Agent, or Firm*—Cermak Kenealy Vaidya & Nakajima LLP

(57) ABSTRACT

An LED can include a pair of electrode members, an LED chip joined on top of a chip mounting portion disposed at an end of one of the pair of electrode members. The LED chip can be electrically connected to both of the pair of electrode members, and a clear resin portion can be formed to surround the LED chip. The clear resin portion can include a wavelength converting material mixed therein, wherein the LED chip emits ultraviolet, blue, or green light, and wherein the wavelength converting material mixed in the clear resin portion converts light from the LED chip to green and red light that is longer in wavelength than the originally emitted light from the LED chip.

2 Claims, 9 Drawing Sheets

LIGHT EMITTING DIODE

This invention claims the benefit of Japanese patent application No. 2004-094774, filed on Mar. 29, 2004, and Japanese patent application No. 2004-094720, filed on Mar. 29, 2004, which are both hereby incorporated by reference.

BACKGROUND OF THE INVENTION

1. Field of the Invention

The invention relates to a light emitting diode (LED), and more particularly to an LED that emits light of so-called electric bulb color such as white, off-white, light blue, light yellow, etc.

2. Description of the Related Art

In recent years, there is an increasingly strong demand for power-saving and long-lasting lighting equipment from the viewpoint of preventing global warming, effectively using resources, and so on. In response thereto, LEDs are rapidly becoming shorter in wavelength and higher in brightness. Particular hope is placed on white LED's that use blue LED's for finding application in lighting.

White LEDs that have a shell-shaped or surface-mount configuration are conventionally known. The conventional white LED is designed to externally emit white light by converting light from a blue LED chip to yellow light with a phosphor layer, and mixing the yellow light with blue light from the blue LED chip to create the white light.

A conventional shell-shaped white LED is configured, for example, as shown in FIG. 7. That is, in FIG. 7, a white LED 1 includes a pair of lead frames 2 and 3, and a blue LED chip 4 mounted on top of a chip mounting portion 2a formed on the upper end surface of the lead frame 2. A phosphor layer 5 is formed surrounding the blue LED chip 4 on top of the chip mounting portion 2a of the lead frame 2 and includes phosphor 5a mixed therein. A lens portion 6 is formed with mold resin so as to surround the upper ends of the lead frames 2 and 3, the blue LED chip 4, and the phosphor layer 5.

The lead frames 2 and 3 are formed with a conductive material such as aluminum and are provided with the chip mounting portion 2a and bonding portions 2b and 3a at respective ends thereof. The other ends of the lead frames extend downward to make up terminal portions 2c and 3b.

The blue LED chip 4 is joined on top of the chip mounting portion 2a of the lead frame 2, with two electrodes provided on the upper surface thereof electrically connected to the bonding portions 2b and 3a at the ends of the lead frames 2 and 3 by bonding wires 4a and 4b. Here, the blue LED chip 4 is configured, for example, as a GaN chip and designed, when applied with a drive voltage via the lead frames 2 and 3, to emit light having a peak wavelength of about 450 to 470 nm.

The phosphor layer 5 is made, for example, of clear epoxy resin into which the phosphor 5a in fine particulate form is mixed. The phosphor layer 5 is formed and hardened on top of the chip mounting portion 2a of the lead frame 2.

As blue light from the blue LED chip 4 falls on the phosphor layer 5, the phosphor 5a is excited, producing yellow light from the phosphor 5a and externally emitting white light as a result of mixing of the two lights. Here, the phosphor 5a includes a phosphor that emits a wide range of lights centering around yellow light such as YAG phosphor doped with cerium, TAG phosphor doped with cerium or orthosilicate phosphor (BaSrCa) $SiO_4$, and is designed to produce a fluorescence, for example, with a peak wavelength of about 530 to 590 nm.

The lens portion 6 is made, for example, of clear epoxy resin, and is formed such that it surrounds the whole area near the upper ends of the lead frames 2 and 3 centering around the blue LED chip 4 and the phosphor layer 5.

Based on the white LED 1 thus configured, the blue LED chip 4 emits light when a drive voltage is applied via the pair of lead frames 2 and 3. The light falls on the phosphor 5a mixed into the phosphor layer 5, exciting the phosphor 5a and producing yellow light. Then, this yellow light is mixed with blue light from the blue LED chip 4, thus causing the mixture to be externally emitted as white light. In this case, white light has a spectrum distribution, for example, as shown in FIG. 8.

On the other hand, a surface-mount white LED 7 can be configured, for example, as shown in FIG. 9. In FIG. 9, the white LED 7 includes a chip substrate 8, a blue LED chip 4 mounted on top of the chip substrate, a frame-shaped member 9 formed on top of the chip substrate 8 so as to surround the blue LED chip 4, and a phosphor layer 5 charged into a depressed portion 9a of the frame-shaped member 9.

The chip substrate 8 is made of a heat-resistant resin as a flat copper clad wired board, and is provided with a chip mounting land 8a and an electrode land 8b on the surface. Surface-mount terminal portions 8c and 8d extend around from these lands onto the lower surface via both end edges. The blue LED chip 4 is joined on top of the chip mounting land 8a of the chip substrate 8, with the blue LED chip 4 electrically connected to the chip mounting land 8a and the electrode land 8b through wire-bonding.

The frame-shaped member 9, similarly formed on top of the chip substrate 8 with a heat-resistant resin, is provided with a recessed portion 9a—a portion in the form of an inverted truncated cone—so as to surround the blue LED chip 4. It is to be noted that the inner surface of the recessed portion 9a is configured as a reflecting surface.

Based on the white LED 7 thus configured, the blue LED chip 4 emits light when a drive voltage is applied via the surface-mount terminal portions 8c and 8d, causing light to fall on the phosphor 5a mixed into the phosphor layer 5, exciting the phosphor 5a and producing yellow light. Then, this yellow light is mixed with blue light from the blue LED chip 4, thus causing the mixture to be externally emitted as white light.

However, there are problems with the white LEDs 1 and 7 configured as described above. For example, blue light emitted from the blue LED chip 4 is converted in wavelength by the phosphor 5a to produce yellow light, with blue and yellow lights mixed together to emit white light. This white light has a color temperature, for example, of 5000 to 6000K. In contrast, an incandescent lamp (a lamp conventionally used over the last 100 plus years), has a color temperature, for example, of 2800 to 3000K.

Incidentally, when a conventional white LED lamp is used in place of an incandescent lamp in lighting equipment, the white LED produced light appears as a bluish white light unlike the so-called electric bulb light color for an incandescent lamp (which appears as a warm-looking color tinged with red). This is true because the conventional white LED light has insufficient light intensity in the red region, as shown in FIG. 8, due to relatively high color temperature as described above, thus giving a cold impression.

On the other hand, while a red phosphor that produces red light by excitation with blue light—a recent development—may be used, red phosphors are generally made of alkaline earth metal and therefore vulnerable to humidity, making it difficult to configure a highly reliable LED and difficult to obtain a sufficient intensity of red light.

SUMMARY OF THE INVENTION

In light of the above, and in accordance with an aspect of the invention, a white LED light can be provided that emits warm-looking white light and which has a simple configuration.

According to a second aspect of the invention there is provided an LED that can include a pair of electrode members, an LED chip joined on top of a chip mounting portion disposed at an end of one of the pair of electrode members, the LED chip being electrically connected to both of the pair of electrode members, and a clear resin portion formed such that it surrounds the LED chip. The clear resin portion can include a wavelength converting material mixed therein, wherein the LED chip emits ultraviolet, blue and/or green light, and wherein the wavelength converting material mixed in the clear resin portion converts at least part of the light from the LED chip to green and/or red light that is longer in wavelength.

In the above-described LED, the pair of electrode members can include two lead frames extending parallel with each other. The LED can further include a lens portion made of a clear resin that surrounds both the LED chip and the clear resin portion. The pair of electrode members can also be configured with a conductive pattern formed on a chip substrate and which extends around onto the rear surface of the chip substrate to define surface-mount terminals. The clear resin portion can be charged into a recessed portion that is upwardly spread in such a manner as to expose a chip mounting portion formed on top of the chip substrate.

The wavelength converting material can be configured to produce green light having a peak wavelength of about 535 to 560 nm and red light having a peak wavelength of about 620 to 640 nm as converted from the light originally emitted from the LED chip. The wavelength converting material can also contain thiogallate phosphor as a first phosphor and rare-earth-activated aluminate or rare-earth-activated orthosilicate as a second phosphor. The wavelength converting material can be dispersed in an alicyclic epoxy resin that does not containing phenyl radical or olefin-based resin.

Based on the above configuration, a drive voltage can be applied to an LED chip via a pair of electrode members, thus allowing the LED chip to emit light. Then, ultraviolet, blue or green light emitted from the LED chip can be externally emitted via a clear resin portion. At this time, part of the light emitted from the LED chip can be directed to fall on a wavelength converting material within a clear resin portion, thus exciting the wavelength converting material and emitting green light having a peak wavelength of about 535 to 560 nm and red light having a peak wavelength of about 620 to 640 nm. Thus, ultraviolet, blue or green light and green and red light from the wavelength converting material can be mixed together, making it possible to obtain warm-looking white light having light characteristics in the red region. The white light has excellent color reproducibility, as compared with a conventional white LED that emits bluish white light by mixing blue light and yellow fluorescence.

It is possible to obtain a shell-shaped LED by configuring the pair of electrode members as two lead frames extending parallel or substantially parallel with each other and further providing a lens portion made of a clear resin that surrounds both the LED chip and the clear resin portion.

It is also possible to obtain a surface-mount LED by configuring the pair of electrode members as a conductive pattern formed on a chip substrate and including surface-mount terminals by extending the pattern around onto the rear surface of the chip substrate. The clear resin portion can be charged into an upwardly spread recessed portion so as to expose a chip mounting portion of a frame-shaped member formed on top of the chip substrate.

A highly reliable LED can be obtained when the wavelength converting material contains thiogallate phosphor as a first phosphor and rare-earth-activated aluminate or rare-earth-activated orthosilicate as a second phosphor. The high resistance of these materials to humidity results in high reliability and other benefits.

A highly reliable LED can also be created when the wavelength converting material is dispersed in alicyclic epoxy resin not containing phenyl radical or olefin resin. The wavelength converting material can remain similarly unaffected by humidity thanks to secure sealing.

Thus, by radiating ultraviolet, blue or green light from the LED chip and converting the light from the LED chip to green and red light with the wavelength converting material, and radiating the resultant light, it is possible through mixing of these lights to obtain a white LED with excellent color reproducibility and reliability. Therefore, warm-looking white light containing light in the red range can be radiated, making the white LED applicable for use in various lighting equipment such as lighting sources for a variety of lighting instruments and LCD backlights (in place of conventional incandescent and other lamps). This makes it possible to obtain the same lighting effect as when a conventional incandescent or other conventional lamp is used, and at the same time obtaining a long-lasting light source with low power consumption and heat generation, among other benefits.

According to a third aspect of the invention there is provided an LED that can include a pair of electrode members, two LED chips joined on top of a chip mounting portion disposed at an end of one of the pair of electrode members, each of the LED chips being electrically connected to both of the pair of electrode members, and a clear resin portion formed such that it surrounds the LED chips. The clear resin portion can include a wavelength converting material mixed therein, wherein one of the LED chips emits blue light, and another of the LED chips emits red light, wherein the wavelength converting material mixed in the clear resin portion converts at least part of the light from the one LED chip to green light that is longer in wavelength.

In the above-described LED, the one of the LED chips that emits blue light can have a peak wavelength of about 440 to 480 nm, and the other of the LED chips that emits red light can have a peak wavelength of about 620 to 660 nm. The wavelength converting material can be configured to convert blue light from the one LED chip into green light that can have a peak wavelength of about 535 to 560 nm.

Based on the above configuration, a drive voltage can be applied to two LED chips via a pair of electrode members, thus allowing the LED chips to emit blue light and red light. So, one of the LED chips emits blue light that can have a peak wavelength of about 420 to 480 nm, and another of the LED chips emits red light that can have a peak wavelength of about 620 to 660 nm. Then, blue and red light emitted from the LED chips can be externally emitted via a clear resin portion. At this time, part of the blue light emitted from the one of the LED chips can be directed to fall on a wavelength converting material within a clear resin portion, thus exciting the wavelength converting material and emitting green light that can have a peak wavelength of about 535 to 560 nm. Thus, blue light, red light, and green light can be mixed together, making it possible to obtain warm-looking white light having light characteristics in the red region. The white light can have excellent color reproducibility, as compared with a conventional white LED that emits bluish white light by mixing blue light and yellow fluorescence.

Thus, by radiating blue and red light from the LED chips and converting the blue light from one of the LED chips into green light with the wavelength converting material, and radiating the resultant so-called primaries light, it is possible through mixing of these lights to obtain a white LED with excellent color reproducibility and reliability. Therefore, warm-looking white light containing light in the red range can be radiated, making the white LED applicable for use in various lighting equipment such as lighting sources for a variety of lighting instruments and LCD backlights (in place of conventional incandescent and other lamps). This makes it possible to obtain the same lighting effect as when a conventional incandescent or other conventional lamp is used, and at the same time obtaining a long-lasting light source with low power consumption and heat generation, among other benefits.

BRIEF DESCRIPTION OF THE DRAWINGS

The above and other aspects, features and advantages of the invention will become more apparent from the following detailed description when taken in conjunction with the accompanying drawings, in which.

DETAILED DESCRIPTION OF PREFERRED EMBODIMENTS

A detailed description will be given below of embodiments of the invention with reference to FIGS. 1 to 6. It is to be noted that while the embodiments described below are specific examples and thereby include various technical features, the scope of the invention is not limited to these embodiments.

Figure 1:
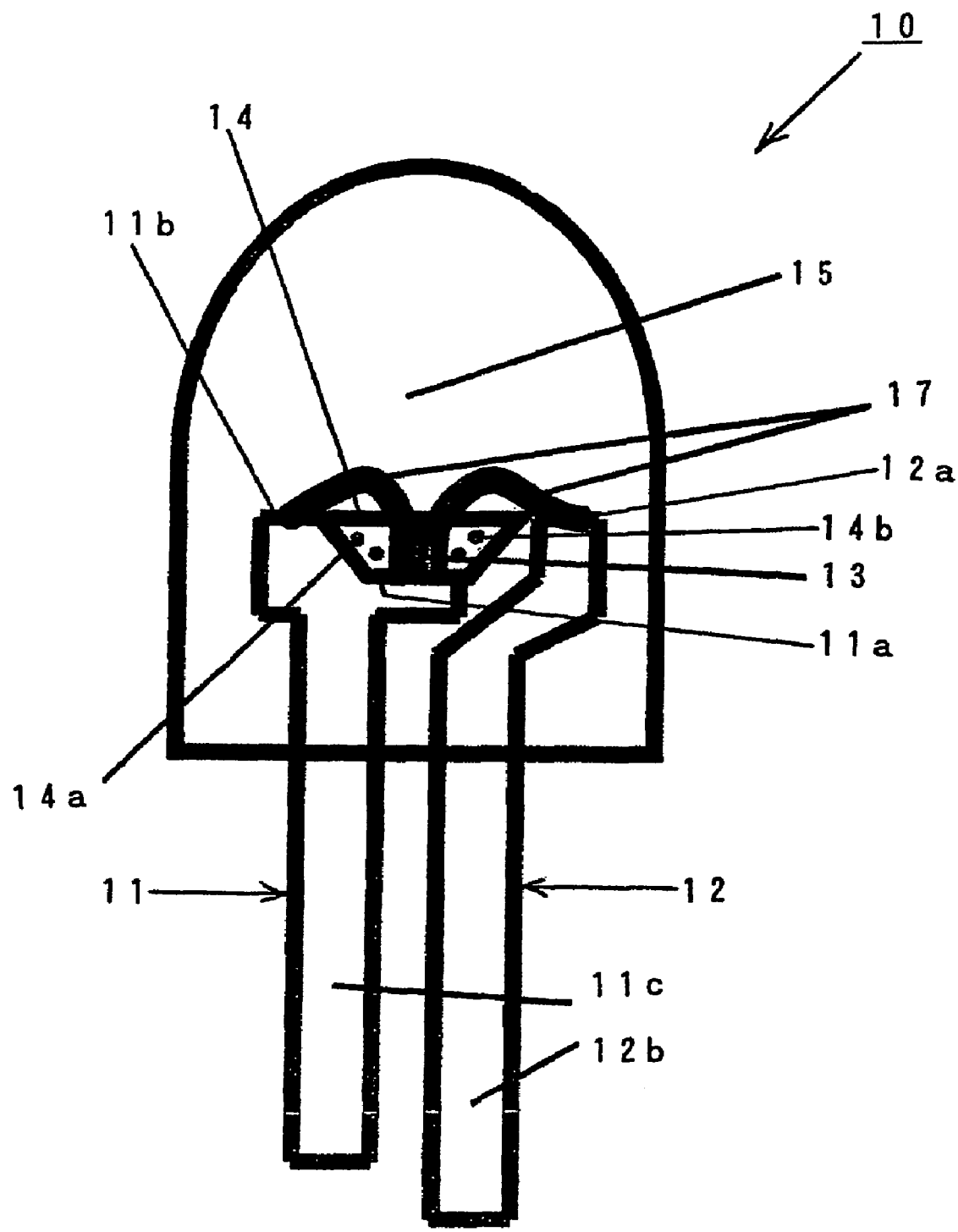
FIG. 1 is a schematic sectional view showing a configuration of a first embodiment of an LED made in accordance with the principles of the invention.

FIG. 1 shows a configuration of a first embodiment of an LED made in accordance with the principles of the invention. In FIG. 1, an LED 10 can be configured as a so-called shell-shaped LED and can include a pair of lead frames 11 and 12, a blue LED chip 13 mounted on top of a chip mounting portion 11a formed on the upper end surface of the lead frame 11, and a clear resin portion 14 formed so as to be adjacent to and/or surround the blue LED chip 13 on top of the chip mounting portion 11a of the lead frame 11. A phosphor 14a can be mixed into the clear resin portion 14 and a lens portion 15 can be formed with a mold resin so as to be adjacent to and/or surround the upper ends of the lead frames 11 and 12, the blue LED chip 13 and the clear resin portion 14.

The lead frames 11 and 12 can be formed out of a conductive material such as aluminum and can be provided with the chip mounting portion 11a and bonding portions 11b and 12a at the respective upper ends thereof. Whereas the other ends of the lead frames can be formed to extend downward to make up terminal portions 11c and 12b.

The blue LED chip 13 can be joined on top of the chip mounting portion 1a of the lead frame 11, with two electrodes provided on the upper surface thereof electrically connected to the bonding portions 11b and 12a at the ends of the lead frames 11 and 12 through wire-bonding 17.

Here, the blue LED chip 13 can be configured, for example, as a GaN chip and can be designed such that when a drive voltage is applied via the lead frames 11 and 12, light is emitted having a peak wavelength of about 450 to 470 nm.

The clear resin portion 14 can be configured by combining, for example, epoxy resins hardened with acid anhydride or cation or olefin-based resins—resins into which the first phosphor 14a and a second phosphor 14b in fine particulate form can be mixed—and can be formed and hardened on top of the chip mounting portion 11a of the lead frame 11.

When blue light from the blue LED chip 13 falls on the clear resin portion 14, the first phosphor 14a is excited, producing green light from the phosphor 14a. At the same time, the second phosphor 14b is excited, producing red light from the phosphor 14b. Here, the first phosphor 14a can include, for example, thiogallate phosphor and can be designed to produce green fluorescence having a peak wavelength of about 535 to 560 nm.

On the other hand, the second phosphor 14b can include YAG phosphor doped with cerium, TAG phosphor doped with cerium or orthosilicate phosphor, and can be designed to produce red fluorescence having a peak wavelength of about 620 to 640 nm.

The lens portion 15 can be made, for example, of clear epoxy resin, and can be formed such that it is adjacent to and/or surrounds the whole area near the upper ends of the lead frames 11 and 12 centering around the blue LED chip 13 and the clear resin portion 14. The LED 10 can be configured as described above, and the blue LED chip 13 can produce blue light emission when a drive voltage is applied via the pair of lead frames 11 and 12. Then, part of the light emitted from the LED chip 13 can fall on the phosphors 14a and 14b that are mixed into the clear resin portion 14, thus exciting the phosphors 14a and 14b and producing green and red light. The green and red light can be mixed with blue light from the LED chip 13, turning the subsequently emitted light into white light that can fall on the lens portion 15 through the clear resin portion 14 and be further emitted externally from the lens portion 15.

Figure 2:
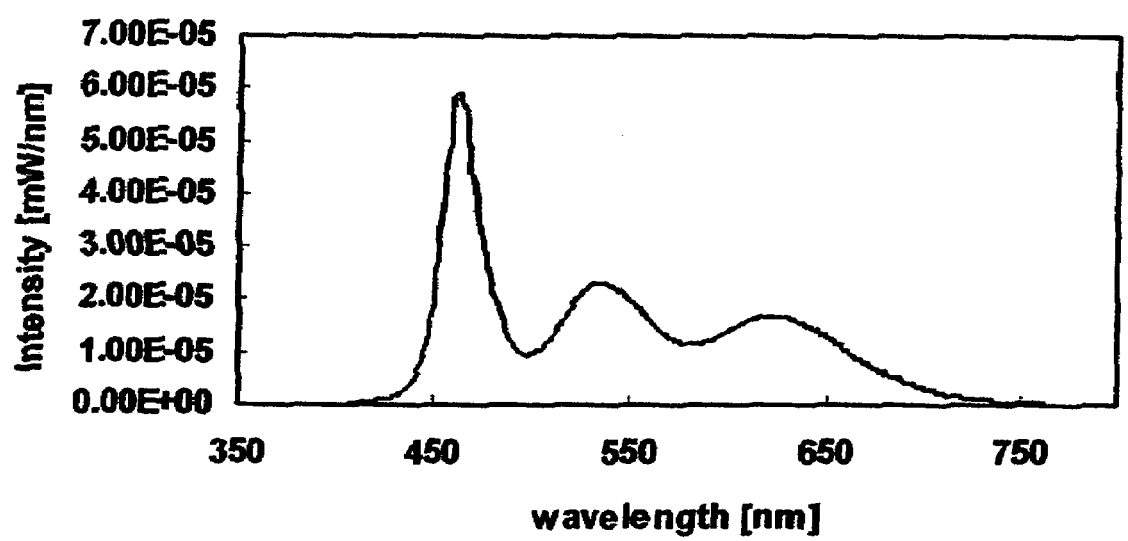
FIG. 2 is a graph showing a spectrum distribution of white light produced by the LED of FIG. 1.

Thus, based on the surface-mount white LED 10, blue light from the LED chip 13 can be mixed with green and red light produced by the phosphor layers 14a and 14b, thus making it possible to obtain white light including light in the red range and light that is excellent in color reproducibility and, in particular, can approximate the light color produced by a typical electric bulb. A spectrum distribution of the white light is shown in the graph of FIG. 2.

The phosphors 14a and 14b can also be securely sealed by the clear resin, thus making it possible to obtain a highly reliable LED 10 that is relatively resistant to humidity.

Figure 3:
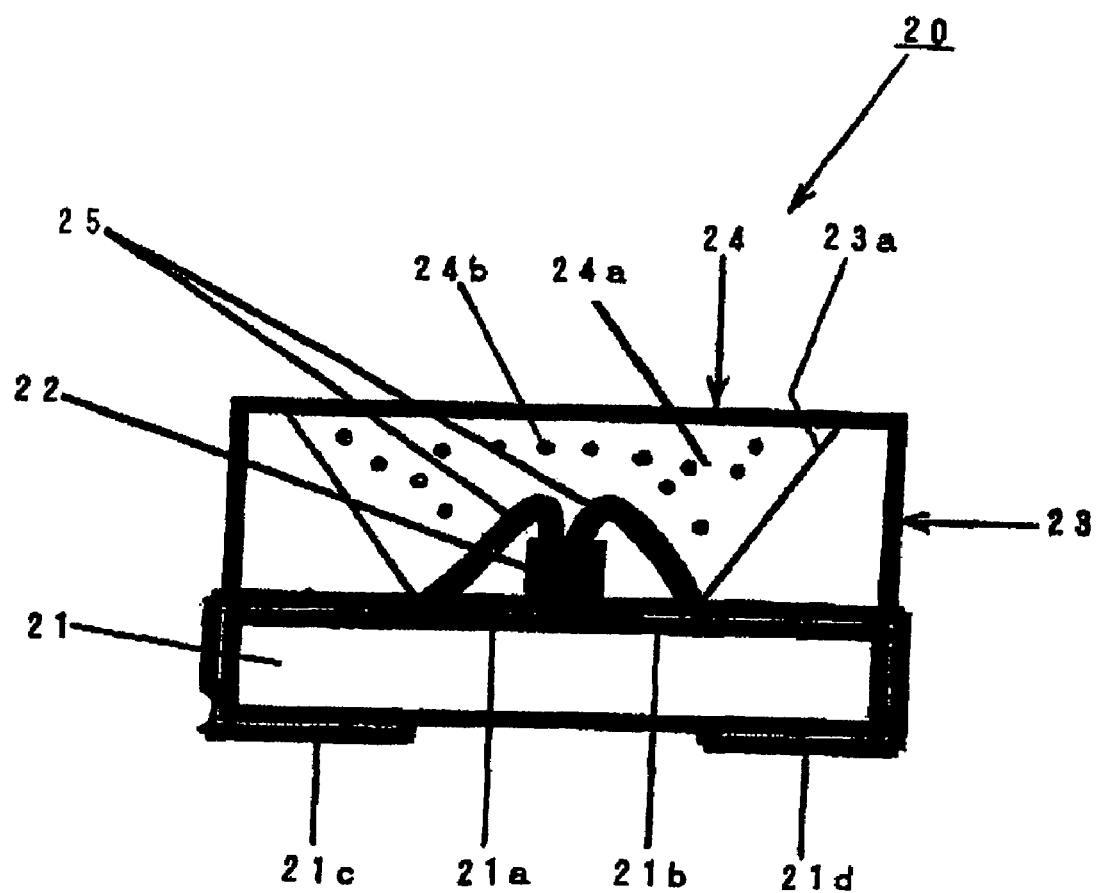
FIG. 3 is a schematic sectional view showing a configuration of a second embodiment of an LED made in accordance with the principles of the invention.

FIG. 3 shows a configuration of a second embodiment of an LED. In FIG. 3, an LED 20 is configured as a so-called surface-mount LED and can include a chip substrate 21, a blue LED chip 22 mounted on top of the chip substrate 21, a frame-shaped member 23 formed on top of the chip substrate 21 such that it is adjacent to and/or surrounds the blue LED chip 22. A clear resin portion 24 can be charged into a recessed portion 23a of the frame-shaped member 23 to cover the blue LED chip 22.

It is to be noted that the blue LED chip 22 and the clear resin portion 24 can have the same configuration as in the LED chip 13, and that the clear resin portion 14 of the LED 10 shown in FIG. 1 can be omitted.

The chip substrate 21 can be made of a heat-resistant resin and include a flat copper clad wired board. A chip mounting land 21a, and an electrode land 21b can be provided on a surface of the chip substrate 21. Surface-mount terminal portions 21c and 21d can be configured such that they extend around from these lands onto the lower surface via both end edges of the chip substrate 21.

The blue LED chip 22 can be joined on top of the chip mounting land 21a of the chip substrate 21, with the surface of the blue LED chip 22 electrically connected to the chip mounting land 21a and the adjacent electrode land 21b through wire-bonding 25. The frame-shaped member 23, can also be formed on top of the chip substrate 21 with a heat-resistant resin, and can be provided with a recessed portion 23a (for example, a portion in the form of an inverted truncated cone) so as to be adjacent to and/or surround the blue LED chip 22. It is to be noted that the inner surface of the recessed portion 23a can be configured as a reflecting surface.

Based on the white LED 20 thus configured, the blue LED chip 22 can emit blue light when a drive voltage is applied via the surface-mount terminals 21c and 21d. Then, part of blue light emitted from the LED chip 22 can be directed to fall on phosphors 24a and 24b that are mixed into the clear resin portion 24, thus exciting the phosphors 24a and 24b and producing green and red light. The green and red light can then mix with blue light from the LED chip 22, turning the light into white light. The white light can then be directed to pass through the clear resin portion 24. Part of the white light can be directly emitted while another part is reflected by the inner surface of the recessed portion 23a of the frame-shaped member 23, thus being externally emitted.

The above-described LED 20 can function similar to the LED 10 shown in FIG. 1, mixing blue light emitted from the LED chip 22 with green and red light produced by the phosphor layers 24a and 24b to produce white light. The white light can include light in the red range that is excellent in color reproducibility and, in particular, can have a color similar to the color of light for a conventional electric bulb.

The phosphors 24a and 24b can be securely sealed by the clear resin, thus making it possible for the LED 20 to be highly reliable and relatively resistant to humidity.

In the above-described embodiments, the LED chip can have a peak wavelength of about 450 to 470 nm. However, the invention is not limited thereto, and the range can be broadened such that the LED chip has a peak wavelength, for example, of about 440 to 480 nm. The LED chip is also not limited to a blue LED chip and may be an ultraviolet or green LED chip.

On the other hand, while in the above-described embodiments, epoxy resins hardened with acid anhydride or cation or olefin-based resins can be combined for use as the clear resin to make up the clear resin portions 14 and 24, the invention is not limited thereto. The phosphors 14a, 14b, 24a and 24b can be dispersed and securely sealed, and alicyclic epoxy resin not containing phenyl radical or olefin resin, for example, may also be used. Thus, it is possible to provide, through a simple configuration, an LED capable of emitting warm-looking white light.

Figure 4:
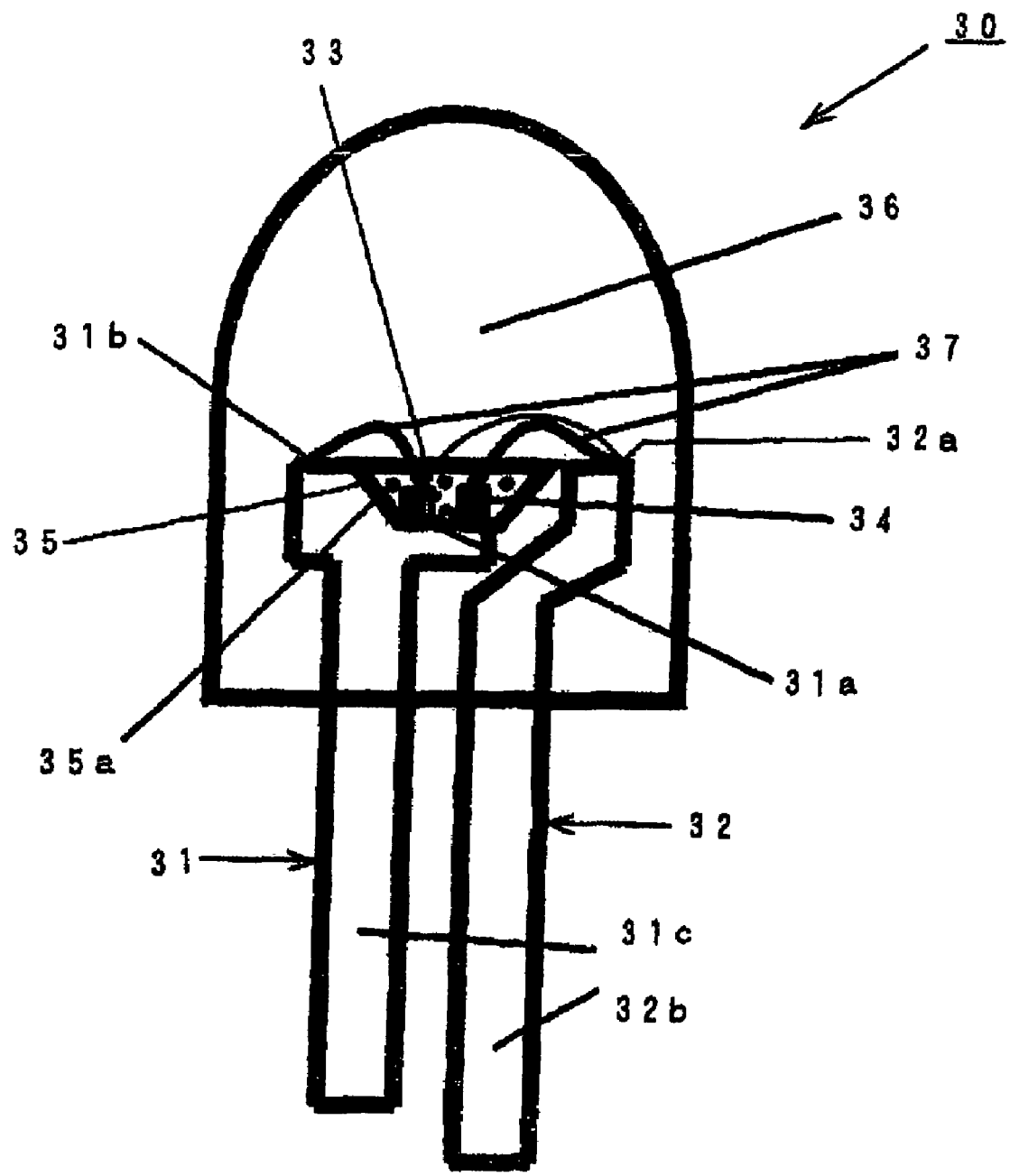
FIG. 4 is a schematic sectional view showing a configuration of a third embodiment of an LED made in accordance with the principles of the invention.

FIG. 4 shows a configuration of a third embodiment of an LED made in accordance with the principles of the invention. In FIG. 4, an LED 30 can be configured as a so-called shell-shaped LED and can include a pair of lead frames 31 and 32, a blue LED chip 33, and a red LED chip 34 mounted adjacent each other on top of a chip mounting portion 31a formed on the upper end surface of the lead frame 31, and a clear resin portion 35 formed so as to be adjacent to and/or surround the blue LED chip 33 and the red LED chip 34 on top of the chip mounting portion 31a of the lead frame 31. A phosphor 35a can be mixed into the clear resin portion 35 and a lens portion 36 can be formed with a mold resin so as to be adjacent to and/or surround the upper ends of the lead frames 31 and 32, the blue LED chip 33, the red LED chip 34 and the clear resin portion 35.

The lead frames 31 and 32 can be formed out of a conductive material such as aluminum and can be provided with the chip mounting portion 31a and bonding portions 31b and 32a at the respective upper ends thereof. Whereas the other ends of the lead frames can be formed to extend downward to make up terminal portions 31c and 32b.

The blue LED chip 33 can be joined on top of the chip mounting portion 31a of the lead frame 31, with two electrodes provided on the upper surface thereof electrically connected to the bonding portions 31b and 32a at the ends of the lead frames 31 and 32 through wire bonding 37.

Here, the blue LED chip 33 can be configured, for example, as a GaN chip and can be designed such that when a drive voltage is applied via the lead frames 31 and 32, light is emitted having a peak wavelength of about 450 to 470 nm. Here the blue LED chip 33 also can be configured as an InGaN chip.

The red LED chip 34 can be die-bonded on top of the chip mounting portion 31a of the lead frame 31, with an electrode provided on the upper surface thereof electrically connected to the bonding portion 32a at the ends of the lead frame 32 through wire-bonding 37.

Here, the red LED chip 34 can be configured, for example, as an AlInGaP chip and can be designed such that when a drive voltage is applied via the lead frames 31 and 32, light is emitted having a peak wavelength of about 620 to 660 nm. Here, the red LED chip 34 also can be configured as an AlGaAs chip.

The clear resin portion 35 can be configured by combining, for example, epoxy resins hardened with acid anhydride or cation or olefin-based resins—resins into which the phosphor 35a in fine particulate form can be mixed—and can be formed and hardened on top of the chip mounting portion 31a of the lead frame 31.

When blue light from the blue LED chip 33 falls on the clear resin portion 35, the phosphor 35a can be excited producing green light from the phosphor 35a. Here the phosphor 35a can include, for example, thiogallate phosphor and can be designed to produce green fluorescence having a peak wavelength of about 535 to 560 nm.

The lens potion 36 can be made, for example, of clear epoxy resin and can be formed such that it is adjacent to and/or surrounds the whole area near the upper ends of the lead frames 31 and 32 centering around the blue LED chip 33, the red LED chip 34 and the clear resin portion 35.

The LED 30 can be configured as described above, and the blue LED chip 33 and the red LED chip 34 can produce blue and red light emission when a drive voltage is applied via the pair of lead frames 31 and 32. Then, part of the blue light emitted from the blue LED chip 33 can fall on the phosphor 35a that is mixed into the clear resin portion 35, thus exciting the phosphor 35a and producing green light. The green light can be mixed with blue and red lights from the LED chips 33 and 34, turning the subsequently emitted light into white light that can fall on the lens portion 36 through the clear resin portion 35 and be further emitted externally from the lens portion 36.

Figure 5:
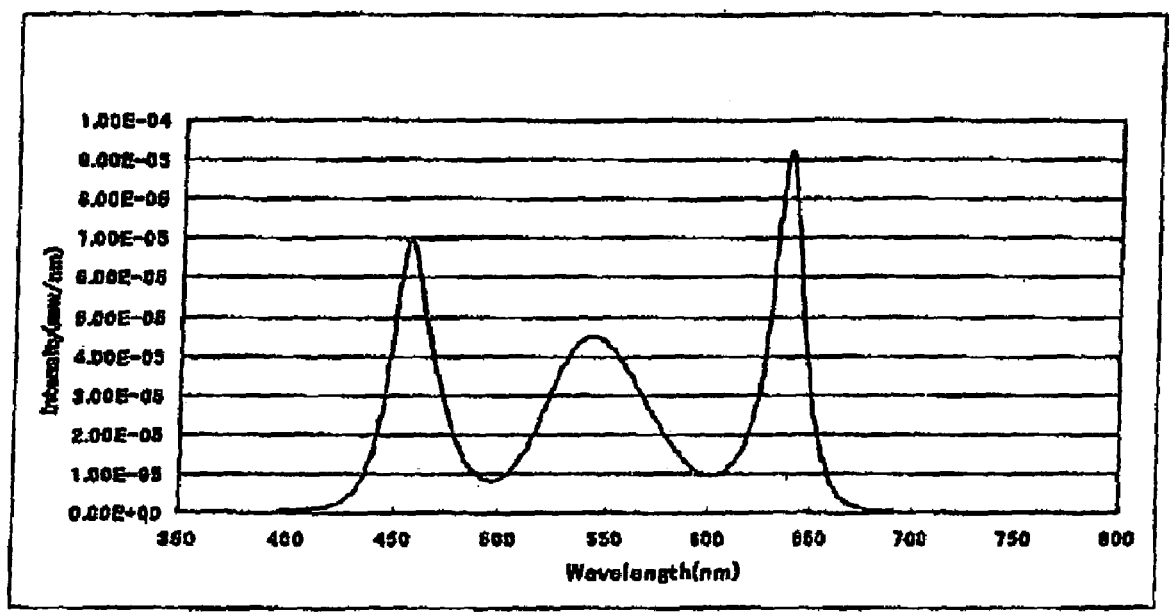
FIG. 5 is a graph showing a spectrum distribution of white light produced by the LED of FIG. 4.

Thus, based on the surface-mount white LED 30, blue and red light from the LED chips 33 and 34 can be mixed with green light produced by the phosphor layer 35a, thus making it possible to obtain white light including light in the red range and light that is excellent in color reproducibility and, in particular, can approximate the light color produced by a typical electric bulb. A spectrum distribution of the white light is shown in the graph of FIG. 5.

The phosphor 35a can also be securely sealed by the clear resin, thus making it possible to obtain a highly reliable LED 30 that is relatively resistant to humidity.

Figure 6:
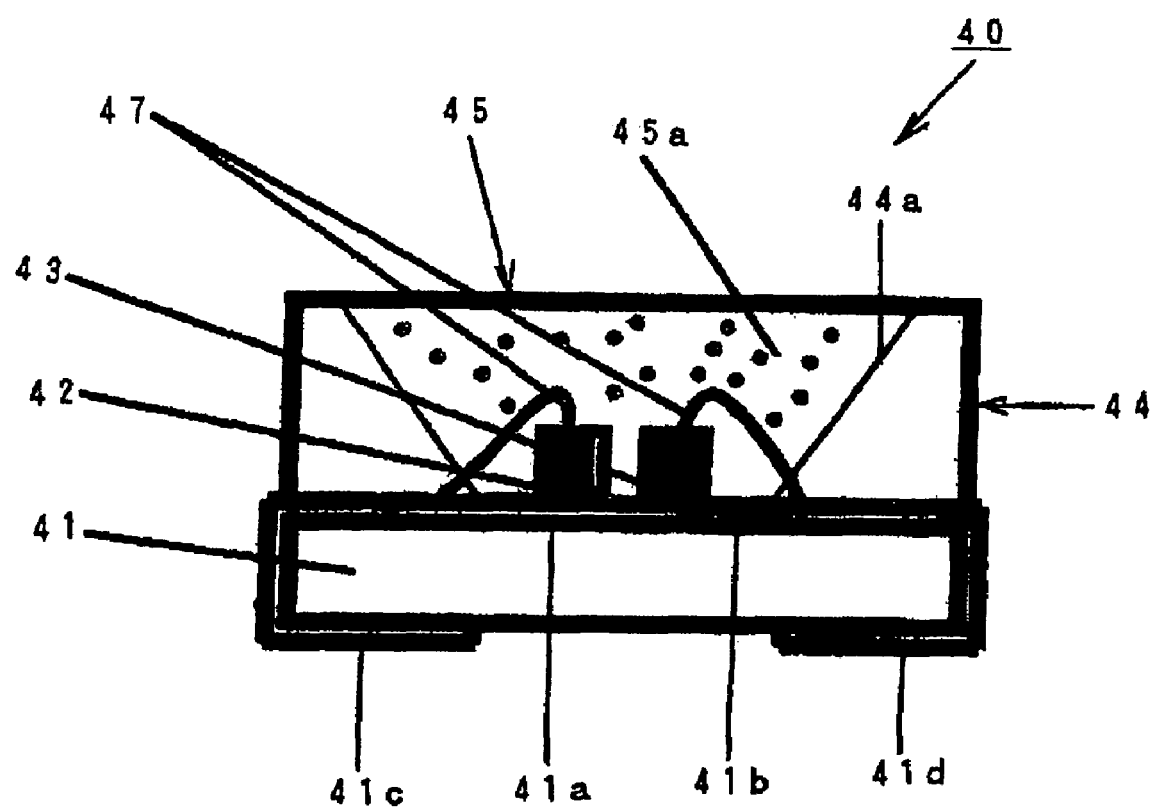
FIG. 6 is a schematic sectional view showing a configuration of a fourth embodiment of an LED made in accordance with the principles of the invention.
Figure 7:
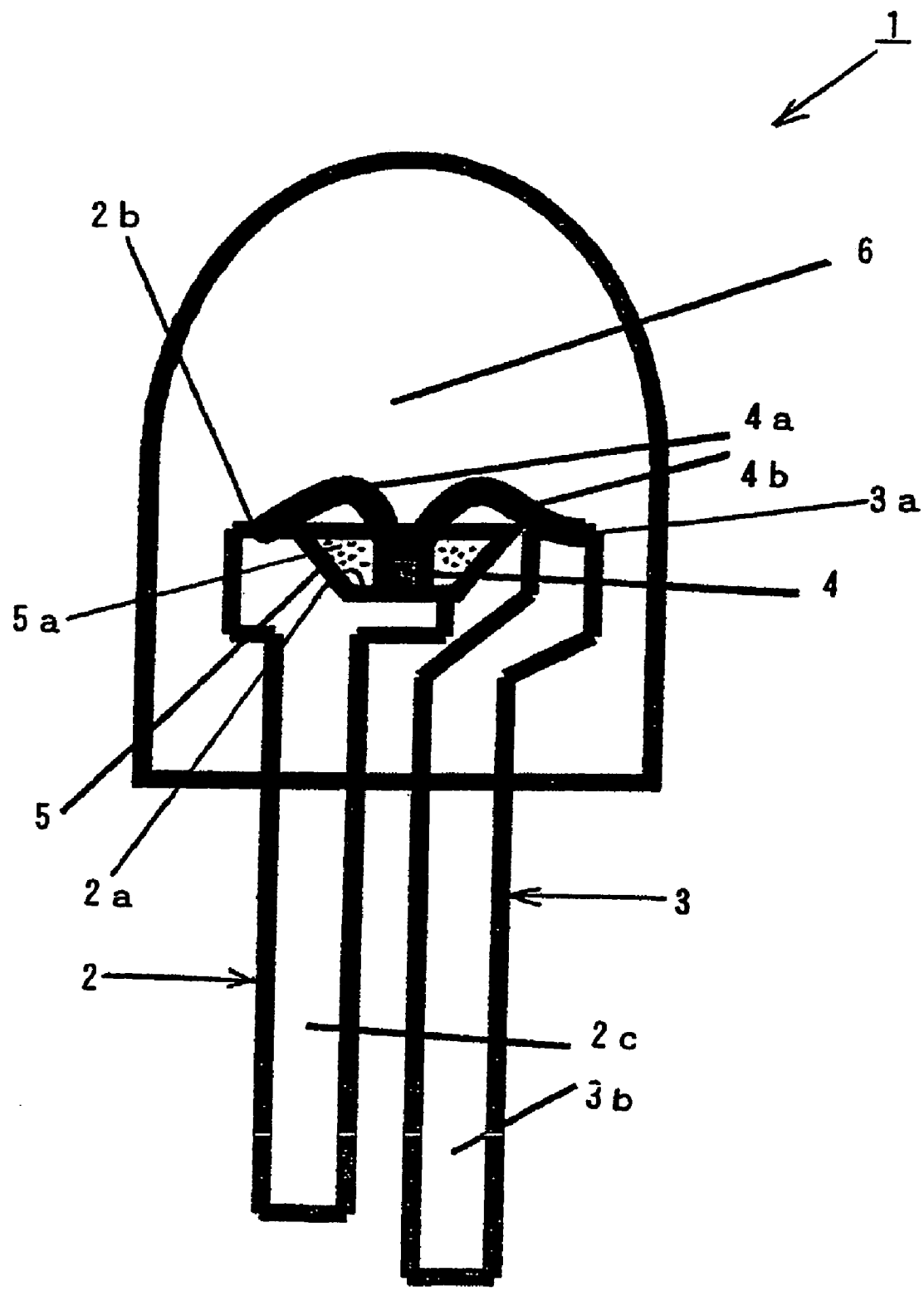
FIG. 7 is a schematic sectional view showing a configuration of an example of a conventional shell-shaped white LED.
Figure 8:
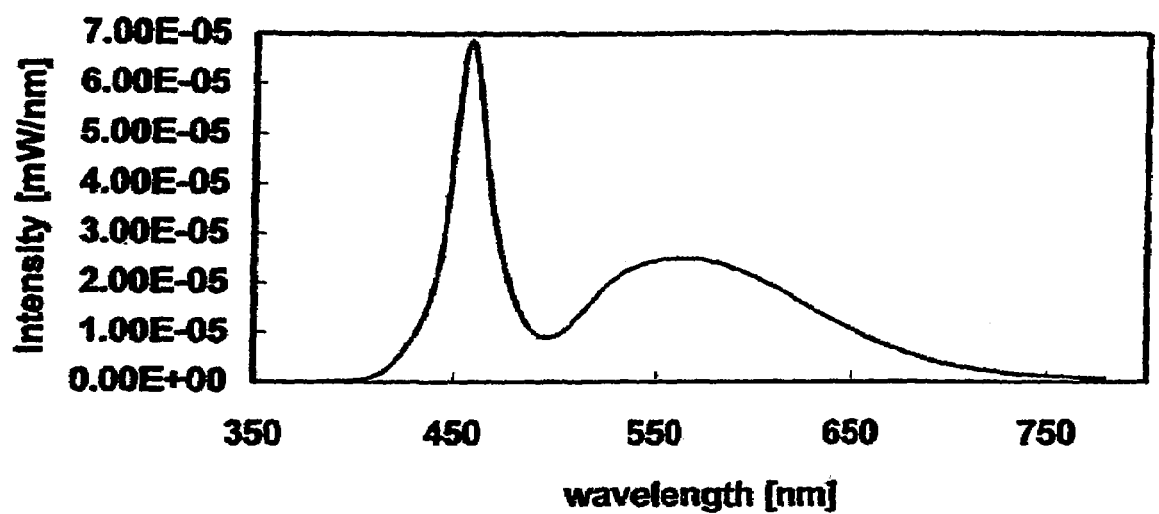
FIG. 8 is a graph showing a spectrum distribution of white light produced by the LED of FIG. 7.
Figure 9:
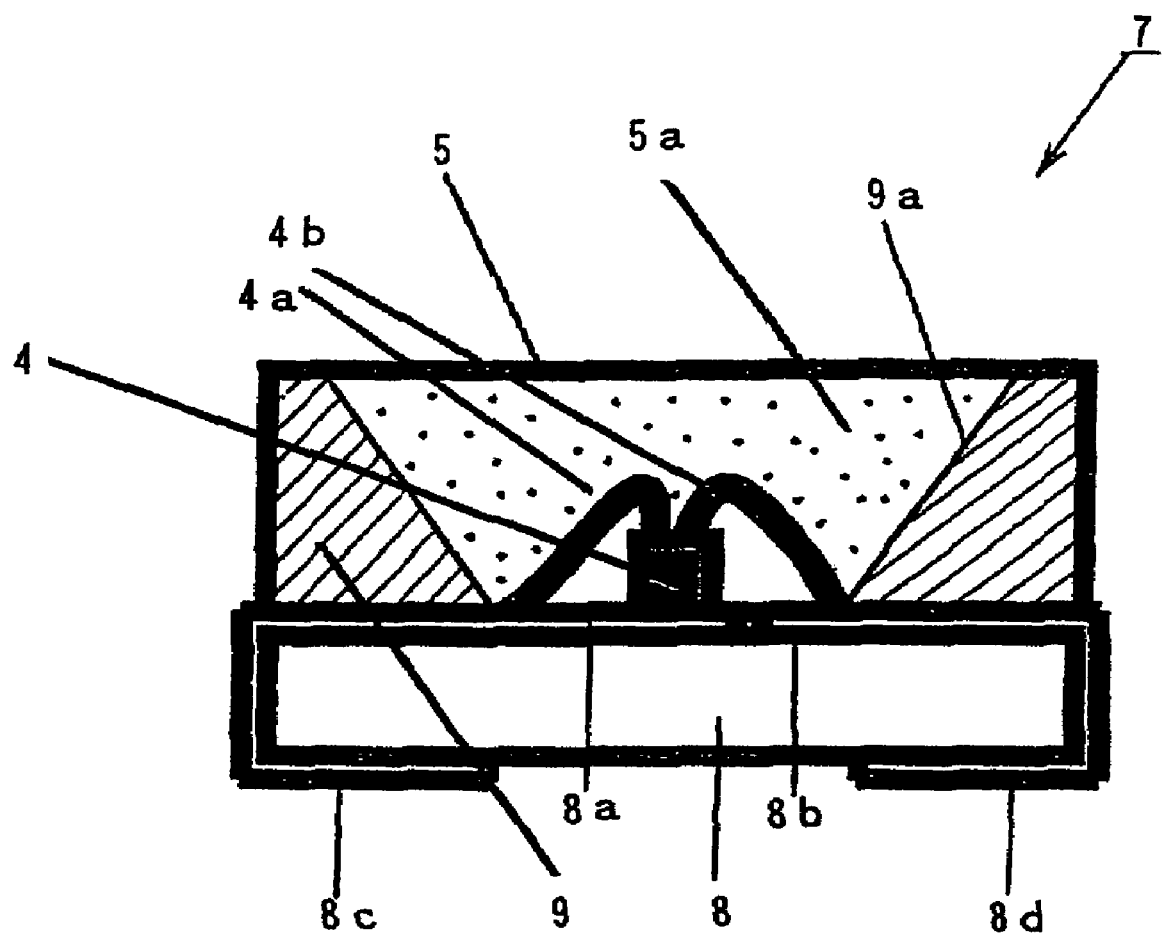
FIG. 9 is a schematic sectional view showing a configuration of an example of a conventional surface-mount white LED.

FIG. 6 shows a configuration of a fourth embodiment of an LED. In FIG. 6, an LED 40 can be configured as a so-called surface mount LED and can include a chip substrate 41, a blue LED chip 42, and a red LED chip 43 mounted on top of the chip substrate 41, a frame-shaped member 44 formed on top of the chip substrate 41 such that it is adjacent to and/or surrounds the blue LED chip 42 and the red LED chip 43. A clear resin portion 45 can be charged into a recessed portion 44a of the frame-shaped member 44 to cover the blue LED chip 42 and the red LED chip 43.

It is to be noted that the blue LED chip 42, the red LED chip 43 and the clear resin portion 45 can have the same configuration as in the LED chip 33 and 34, and that the clear resin portion 35 of the LED 30 shown in FIG. 4 can be omitted.

The chip substrate 41 can be made of a heat-resistant resin and include a flat copper clad wired board. A chip mounting land 41a, and an electrode land 41b can be provided on a surface of the chip substrate 41. Surface-mount terminal portions 41c and 41d can be configured such that they extend around from these lands onto the lower surface via both end edges of the chip substrate 41.

The blue LED chip 42 and the red LED chip 43 can be joined on top of the chip mounting land 41a of the chip substrate 41, with the surface of the blue LED chip 42 electrically connected to the chip mounting land 41a and the adjacent electrode land 41b through wire-bonding 46. The surface of the red LED chip 43 can be electrically connected to the electrode 41b through wire-bonding 46.

The frame-shaped member 44, can also be formed on top of the chip substrate 41 with a heat-resistant resin, and can be provided with a recessed portion 44a (for example, a portion in the form of an inverted truncated cone) so as to be adjacent to and/or surround the blue LED chip 42 and the red LED chip 43. It is to be noted that the inner surface of the recessed portion 44a can be configured as a reflecting surface.

Based on the white LED 40 thus configured, the blue LED chip 42 and the red LED chip 43 can emit blue and red light when a drive voltage is applied via the surface-mount terminals 41c and 41d. Then, part of the blue light emitted from the blue LED chip 42 can be directed to fall on phosphor 45a that is mixed into the clear resin portion 45, thus exciting the phosphor 45a and producing green light. The green light can then mix with blue and red light from the LED chip 42 and 43, turning the light into white light. The white light can then be directed to pass through the clear resin portion 45. Part of the white light can be directly emitted while another part is reflected by the inner surface of the recessed portion 44a of the frame-shaped member 44, thus being externally emitted.

The above-described LED 40 can function similar to the LED 30 shown in FIG. 4, mixing blue and red light emitted from the LED chips 42 and 43 with green light produced by the phosphor layer 45a to produce white light. The white light can include light in the red range that is excellent in color reproducibility and, in particular, can have a color similar to the color of light for a conventional electric bulb.

In the above-described embodiments, the LED chip can have a peak wavelength of about 450 to 470 nm. However, the invention is not limited thereto, and the range can be broadened such that the LED chip has a peak wavelength, for example, of about 440 to 480 nm. The LED chip is also not limited to a blue LED chip and may be an ultraviolet or green LED chip.

On the other hand, while in the above-described embodiments, epoxy resins hardened with acid anhydride or cation or olefin-based resins can be combined for use as the clear resin to make up the clear resin portions 14 and 24, the invention is not limited thereto. The phosphors 14a, 14b, 24a and 24b can be dispersed and securely sealed, and alicyclic epoxy resin not containing phenyl radical or olefin resin, for example, may also be used. Thus, it is possible to provide through a simple configuration, an LED capable of emitting warm-looking white light.

The means for converting light as described above includes a first phosphor and a second phosphor. The first and second phosphors can include thiogallate phosphor as the first phosphor and at least one of rare-earth-activated aluminate and rare-earth-activated orthosilicate as the second phosphor. However, it should be understood that it is within the spirit and scope of the invention for the first and second phosphors to include, comprise, or consist of other materials that are well known to convert light into green and/or red wavelength light. In addition, the wavelength converting material is described above as being dispersed in alicyclic epoxy resin not containing phenyl radical or olefin-based resin. However, other epoxy resins, plastics, crystalline structures and materials can be used to carry the wavelength converting material. Furthermore, while a shell type LED and a surface mount LED are described above, there are other types of LED configurations in which the principles of the invention can be applied.

While illustrative embodiments of the invention have been described in detail herein, it is to be understood that the inventive concepts may be otherwise variously embodied and employed and that the appended claims are intended to be construed to include such variations except insofar as limited by the prior art.

What is claimed is:

1. An LED comprising:
   a pair of electrode members including a chip mounting portion disposed at an end of one of the pair of electrode members;
   two LED chips located adjacent the chip mounting portion, each of the LED chips being electrically connected to both of the pair of electrode members, one of the LED chips is configured to emit UV or blue light having a peak wavelength in 440-480 nm, and another of the LED chips is configured to emit red light having a peak wavelength in 620-660 nm; and
   a clear resin portion located adjacent the LED chips, the clear resin portion including alicycic epoxy resin not containing phenyl radical or olefin-based resin, and the clear resin portion containing a wavelength converting material dispersed therein;

wherein the wavelength converting material dispersed in the clear resin portion converts at least part of the blue light from the one of the LED chips to green light in the wavelength range of 535-560 nm.

2. An LED comprising:

a pair of electrode members including a chip mounting portion disposed at an end of one of the pair of electrode members;

an LED chip located adjacent the chip mounting portion, the LED chip being electrically connected to both of the pair of electrode members; and a clear resin portion located adjacent the LED chip, the clear resin portion including alicyclic epoxy resin not containing phenyl radical or olefin-based resin, the clear resin portion further including thiogallate phosphor as a first wavelength converting material and at least one of rare-earth-activated aluminate and rare-earth activated orthosilicate as a second wavelength converting material mixed therein, wherein the LED chip is configured to emit one of ultraviolet, blue and green light, and wherein the first wavelength converting material mixed in the clear resin portion converts at least part of the light from the LED chip to light that is longer in wavelength than the light emitted by the LED chip, and the second wavelength converting material mixed in the clear resin portion converts at least part of the light from the LED chip to red light.

* * * * *

UNITED STATES PATENT AND TRADEMARK OFFICE
CERTIFICATE OF CORRECTION

PATENT NO. : 7,586,127 B2 Page 1 of 1
APPLICATION NO. : 11/091777
DATED : September 8, 2009
INVENTOR(S) : Tadashi Nomura et al.

It is certified that error appears in the above-identified patent and that said Letters Patent is hereby corrected as shown below:

On the cover page, item (30), please replace the date of the first foreign priority application as follows:

Mar. 29, 2004 (JP) .......................................................... 2004-094720
Mar. 29, 2004 (JP) .......................................................... 2004-094774

Signed and Sealed this
Twentieth Day of September, 2011

David J. Kappos
*Director of the United States Patent and Trademark Office*